United States Patent
Kodama (12) 
(10) Patent No.: US 6,706,593 B1
(45) Date of Patent: *Mar. 16, 2004

(54) METHOD FOR MANUFACTURING A NONVOLATILE SEMICONDUCTOR STORAGE DEVICE

(75) Inventor: Noriaki Kodama, Tokyo (JP)

(73) Assignee: NEC Electroincs Corporation, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1007 days.

(21) Appl. No.: 08/919,674

(22) Filed: Aug. 28, 1997

(30) Foreign Application Priority Data

Aug. 29, 1996 (JP) .............................. 8-228002

(51) Int. Cl.⁷ .......................................... H01L 21/8247
(52) U.S. Cl. ..................... 438/258; 438/265; 438/593
(58) Field of Search ................................ 438/258, 261, 438/264, 265, 593, 594, 655, 656, 657

(56) References Cited

U.S. PATENT DOCUMENTS 5,188,976 A * 2/1993 Kume et al. ................ 438/258
5,223,451 A * 6/1993 Uemura et al. ............. 438/258
5,449,629 A * 9/1995 Kajita ........................ 438/258
5,789,294 A * 8/1998 Choi ......................... 438/258

FOREIGN PATENT DOCUMENTS

| JP | 1-198077 | 8/1989 |
| JP | 3-9572 | 1/1991 |
| JP | 5-235366 | 9/1993 |
| JP | 6-45614 | 2/1994 |
| JP | 8-37245 | 2/1996 |
| JP | 9-129758 | 5/1997 |
| JP | 9-199694 | 7/1997 |

* cited by examiner

*Primary Examiner*—Chandra Chaudhari
(74) *Attorney, Agent, or Firm*—Katten Muchin Zavis Rosenman (57) ABSTRACT

According to the present invention, a method for manufacturing a nonvolatile semiconductor storage device is provided in which an element separating layer and first gate insulating layer are respectively formed onto a silicon base, followed by layering and patterning of a first polysilicon layer. A second gate insulating layer for forming an ONO structure and a second polysilicon layer are then sequentially formed and patterned. After formation of a gate oxide layer, a third polysilicon layer is layered and patterned to form a gate electrode. The second and first polysilicon layers are then patterned to respectively form control gate and floating gate.

13 Claims, 6 Drawing Sheets

MEMORY CELL ARRAY REGION | PERIPHERAL CIRCUIT TRANSISTOR REGION

METHOD FOR MANUFACTURING A NONVOLATILE SEMICONDUCTOR STORAGE DEVICE

BACKGROUND OF THE INVENTION

1. Technical Field of the Invention

The present invention relates to a method for manufacturing a nonvolatile semiconductor storage device. In particular, the present invention relates to a method for manufacturing a nonvolatile semiconductor storage device in which a nonvolatile memory cell transistor possessing a two-layered gate electrode comprising a floating gate and a control gate, and a MOS transistor for use in a peripheral circuit possessing a single gate electrode are formed on the same semiconductor base.

2. Background Art

With regard to this type of nonvolatile semiconductor storage device, wherein a nonvolatile memory cell transistor possessing a two-layered gate electrode comprising a floating gate and a control gate, and a MOS transistor for use in a peripheral circuit possessing a single gate electrode are formed on the same semiconductor base, a gate insulating layer of the floating gate capable of tunneling electrons is required. In contrast, the gate insulating layer of the MOS transistor for use in a peripheral circuit is a layer wherein the tunneling of electrons is not required. Hence these layers must be formed via separate processes. In addition, the gate insulating layer between the floating gate and control gate, and the gate insulating layer of the MOS transistor for use in a peripheral circuit each demand different characteristics, and thus likewise must be formed by means of different processes.

Figure 5A:
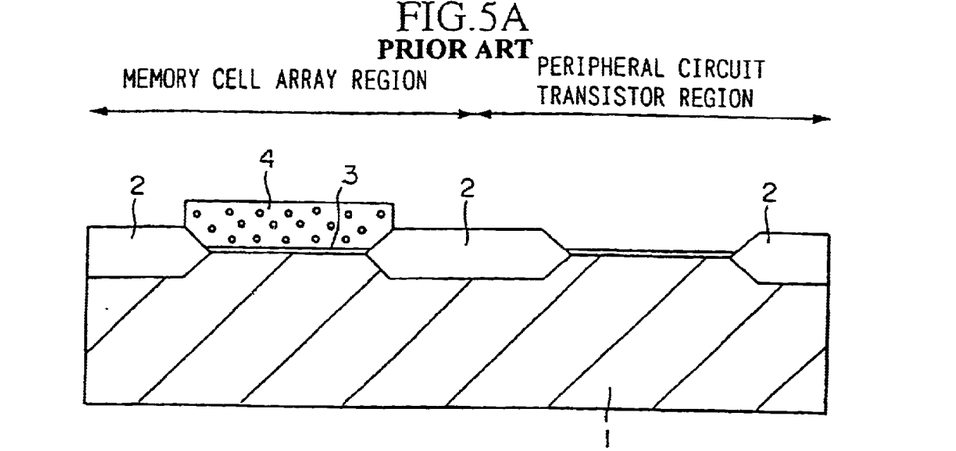
FIGS. 5A~5C are cross sectional diagrams showing a part of a step sequence for explaining a conventional example.
Figure 5B:
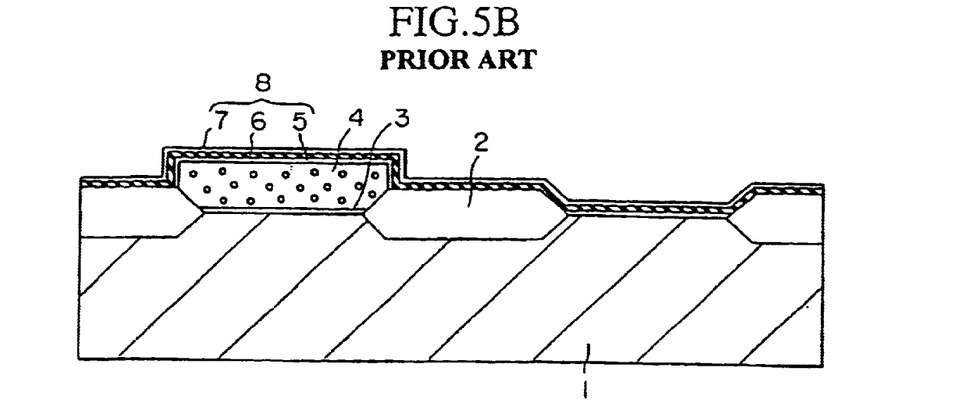
Figure 5C:
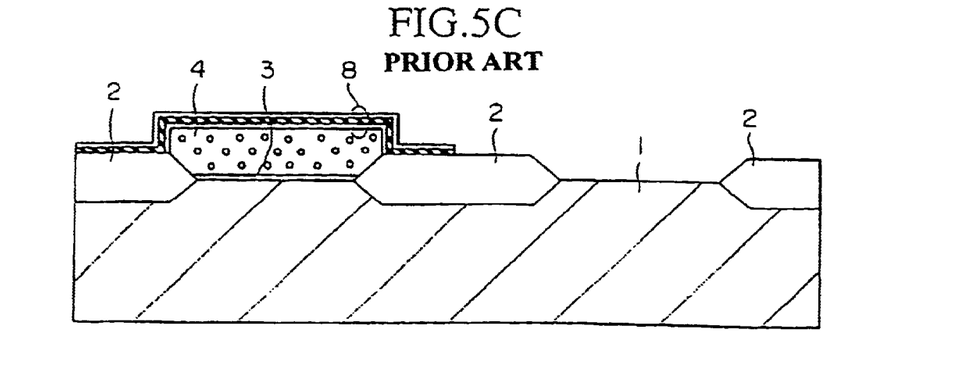

A conventional method for manufacturing a nonvolatile semiconductor storage device will now be explained with reference to FIG. 5A to FIG. 6F. As shown in FIG. 5A, after selectively forming an element separating oxide layer 2 onto the surface of a silicon base 1, a first gate insulating layer 3 is formed in the elemental area segmented off by means of element separating oxide layer 2. A first polysilicon layer 4 is then deposited over the entire surface thereon, and patterned such that this first polysilicon layer is left covering only the elemental area of the memory cell array region. Subsequently, as shown in FIG. 5B, after forming a second gate insulating layer 8 comprising a multi-layered stack, which is composed of, for example, an ONO structure comprising a silicon oxide layer (O) 5, a silicon nitride layer (N) 6 and another silicon oxide layer (O) 7, onto the entire surface of the silicon base 1, etching is selectively performed to remove the second gate insulating layer 8 from a peripheral circuit transistor region, as shown in FIG. 5C.

Figure 6D:
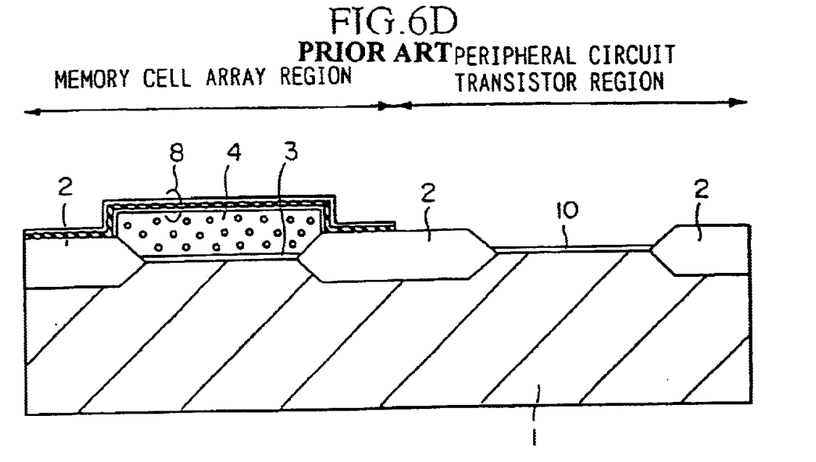
FIGS. 6D~6F are cross sectional diagrams showing subsequent steps following those shown in FIGS. 5A~5C for explaining a conventional example.
Figure 6E:
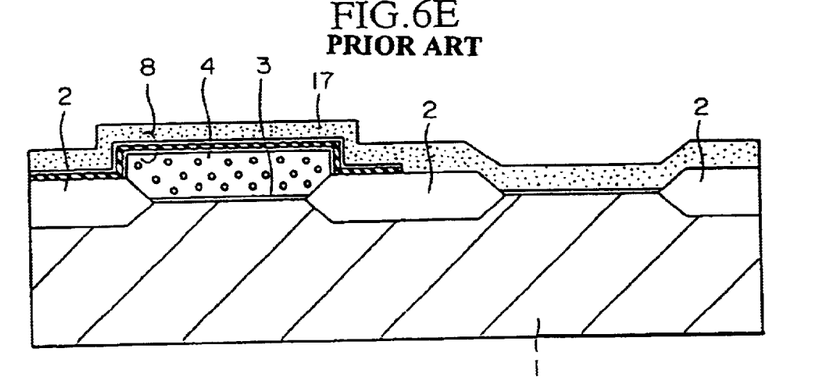
Figure 6F:
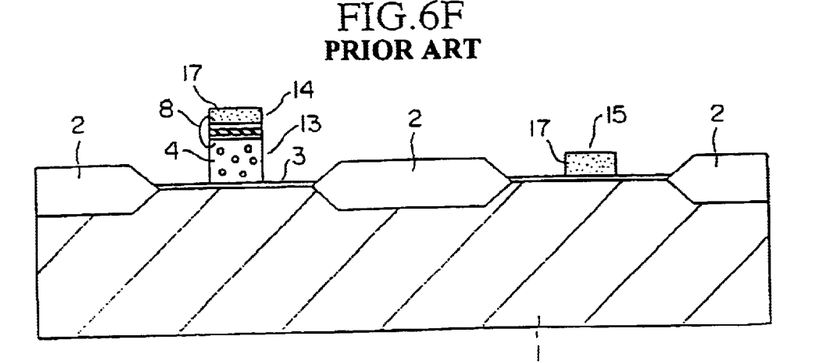

As shown in FIG. 6D, a gate oxide layer 10 is then formed by a thermal oxidization onto the elemental area of the peripheral circuit transistor region, which is followed by formation of a second polysilicon layer 17 over the entire surface of the silicon base 1, as shown in FIG. 6E. Subsequently, as shown in FIG. 6F, second polysilicon layer 17, second gate insulating layer 8 and first polysilicon layer 4 are patterned to respectively form a control gate 14 comprising second polysilicon layer 17 and floating gate 13 comprising first polysilicon layer 4, in the memory cell array region, as well as a gate electrode 15 comprising second polysilicon layer 17 in the peripheral circuit transistor region.

Afterwards, a source-drain region is formed by introducing impurities with the gate electrode and element separating oxide layer 2 serving as a mask. Furthermore, although not shown in the figures, an interlayer insulating layer is formed, contact holes are opened, and an Al wiring is formed to complete process for manufacturing a nonvolatile semiconductor storage device.

According to the aforementioned conventional method for manufacturing a nonvolatile semiconductor storage device, in the state in which a second gate insulating layer comprising an ONO structure is formed on top of a first polysilicon layer forming the floating gate in the memory cell array region, at the time of washing the aforementioned before performing thermal oxidation for the purpose of forming a gate oxide layer in the peripheral transistor region, a major problem arises in that the uppermost silicon oxide layer of the ONO structure in the memory cell array region undergoes "layer thinning". As a result, the electrons which accumulate at the floating gate easily leak through to the control gate leading to further problems such as degradation of the data storage properties and reliability.

Consequently, the present invention is directed to address the problems mentioned above, particularly to prevent thinning of the second gate electrode on the floating gate, in addition to avoiding degradation of the data storage properties of the nonvolatile semiconductor storage device and improving reliability thereof.

SUMMARY OF THE INVENTION

Figure 1A:
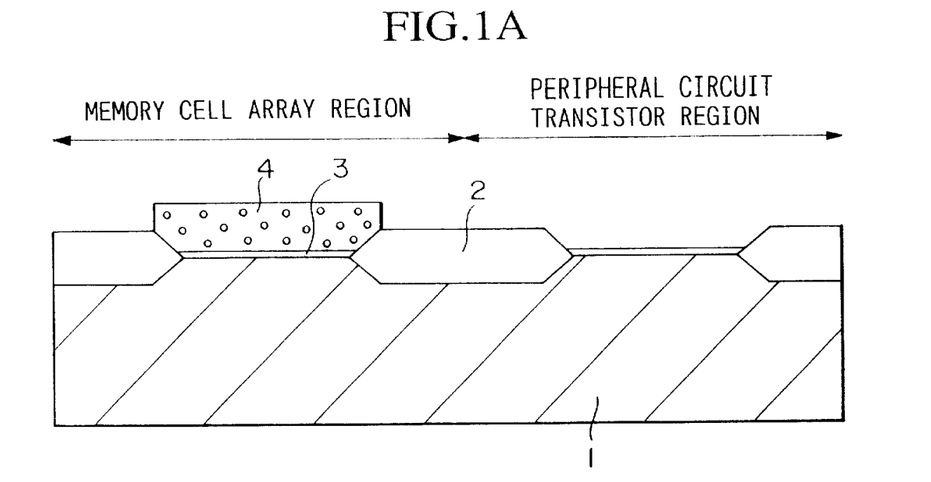
FIGS. 1A~1C are cross sectional diagrams showing a part of a step sequence for explaining a first preferred embodiment of the present invention.
Figure 1B:
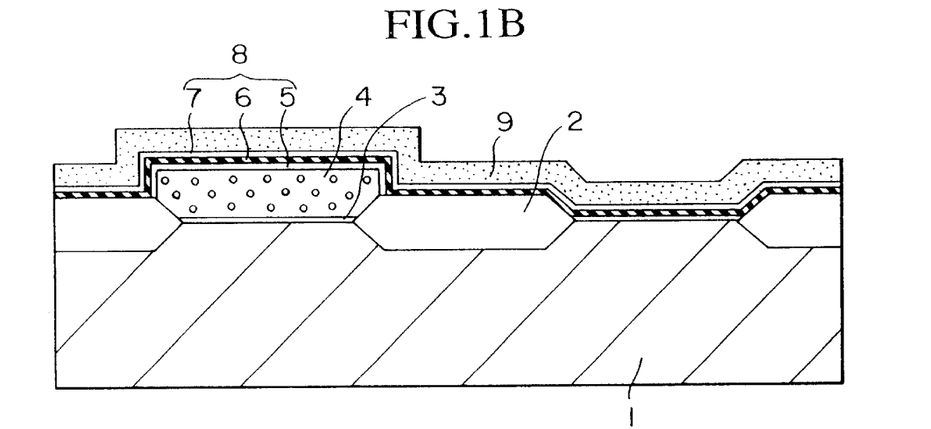
Figure 1C:
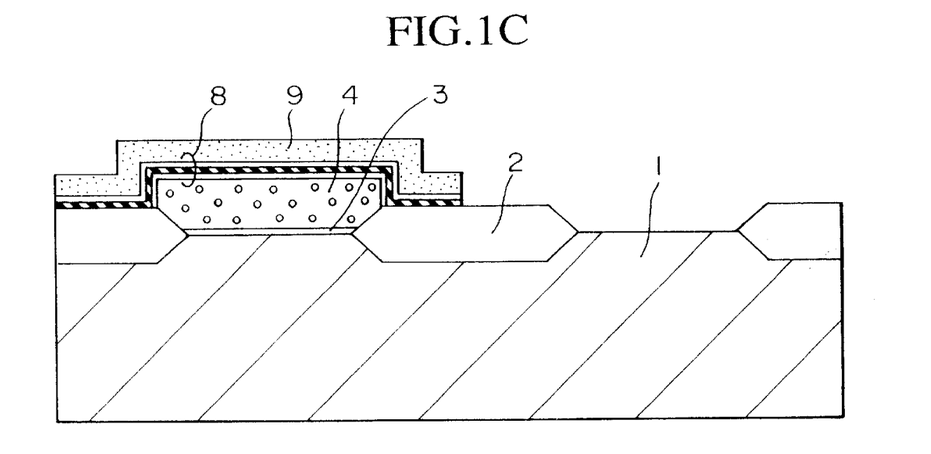
Figure 2D:
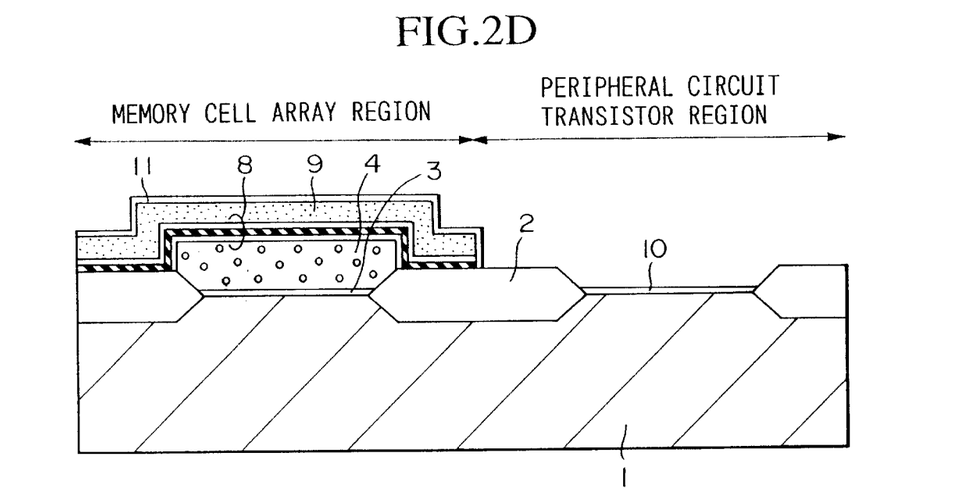
FIGS. 2D~2F are cross sectional diagrams showing subsequent steps following those shown in FIGS. 1A~1C for explaining a first preferred embodiment of the present invention.
Figure 2E:
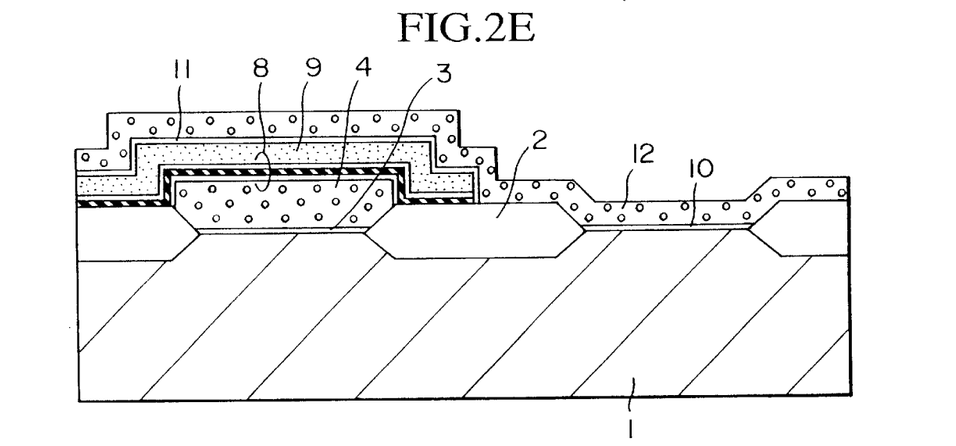
Figure 2F:
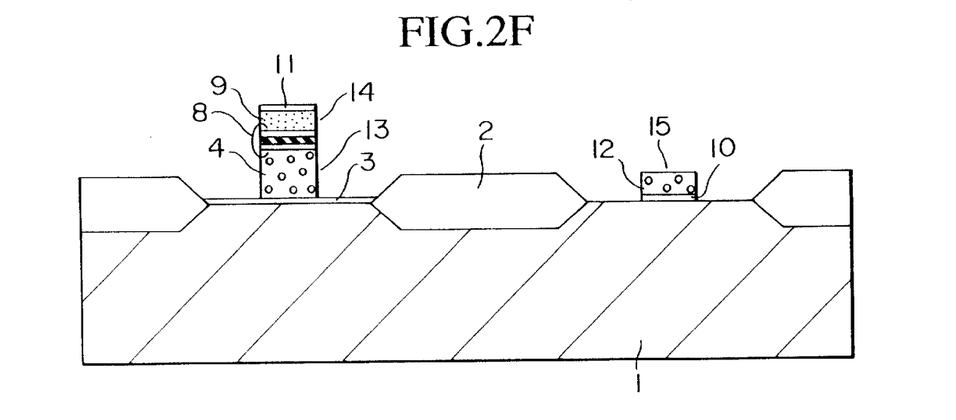

Hence, in consideration of the aforementioned, it is an object of the present invention to provide according to a first aspect of the present invention, a method for manufacturing a nonvolatile semiconductor storage device comprising the steps of:

forming an element separating oxide layer onto a semiconductor base for defining a first region for forming a nonvolatile memory cell and a second region for forming an MOS transistor for use in a peripheral circuit;

forming a first gate insulating layer on said first and second regions over the surface of said semiconductor base;

forming a first polysilicon layer over the entire surface of said semiconductor base, and then patterning said first polysilicon layer in a manner such that said first polysilicon layer is left covering only said first gate insulating layer of said first region (FIG. 1A);

sequentially forming a second gate insulating layer and a second polysilicon layer successively over the entire surface of said first region and said second region (FIG. 1B);

sequentially removing said second polysilicon layer, said second gate insulating layer and said first gate insulating layer, respectively, in said second region (FIG. 1C);

forming a third gate oxide layer over a surface of said semiconductor base corresponding to said second region by means of thermal oxidation (FIG. 2D);

coating a third polysilicon layer over the entire surface of said first region and said second region (FIG. 2E), and patterning said third polysilicon layer to form a gate electrode over said second region; and patterning said second polysilicon layer, said second gate insulating layer, and said first polysilicon layer to form a gate electrode in said first region wherein a control gate is formed from said second polysilicon layer and said a floating gate is formed from a first polysilicon layer (FIG. 2F).

Figure 3A:
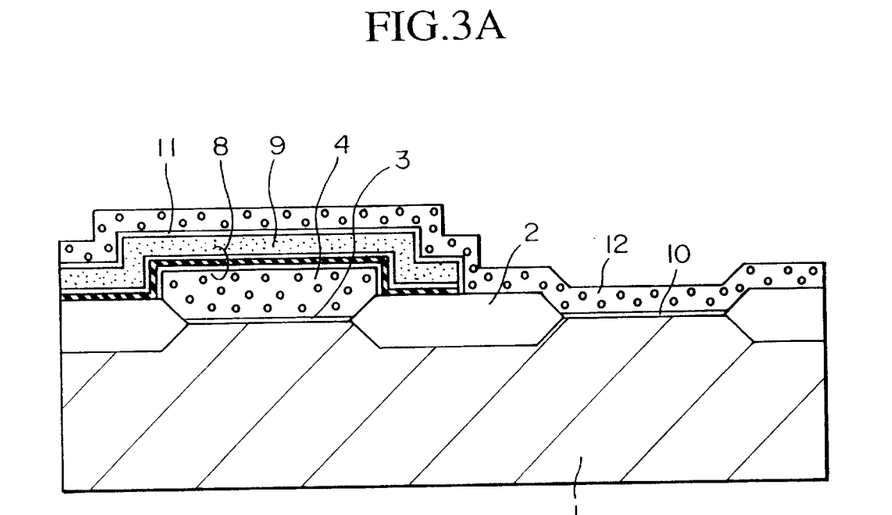
FIGS. 3A~3B are cross sectional diagrams showing a part of a step sequence for explaining a second preferred embodiment of the present invention.
Figure 3B:
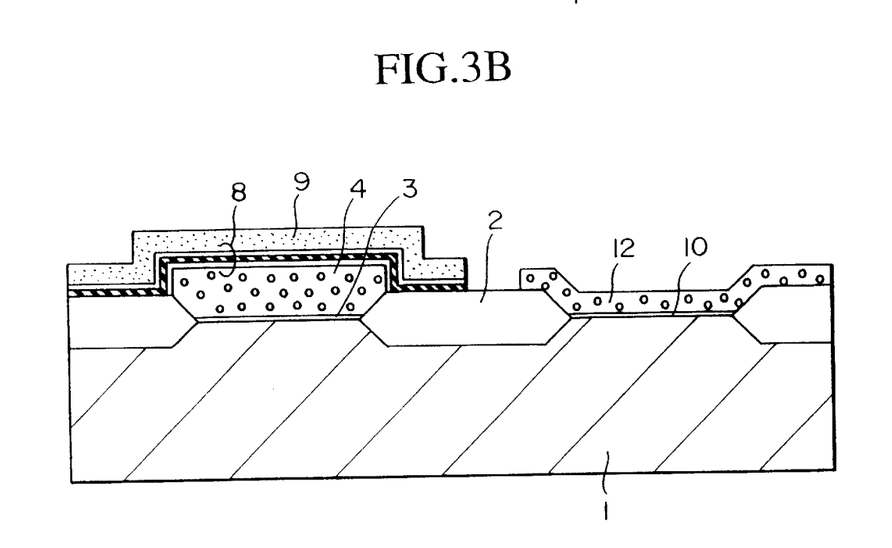
Figure 4C:
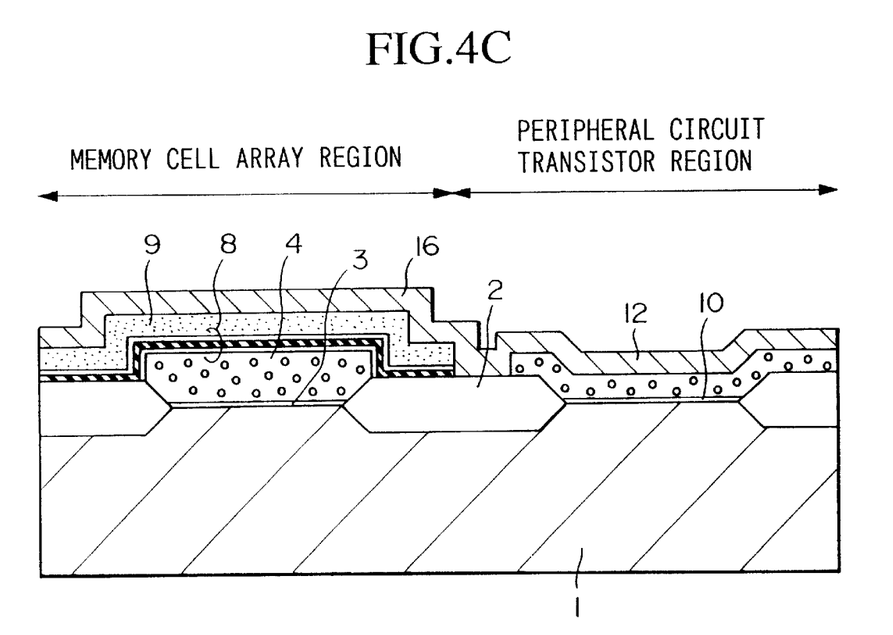
FIGS. 4C~4D are cross sectional diagrams showing subsequent steps following those shown in FIGS. 3A~3B for explaining a second preferred embodiment of the present invention.
Figure 4D:
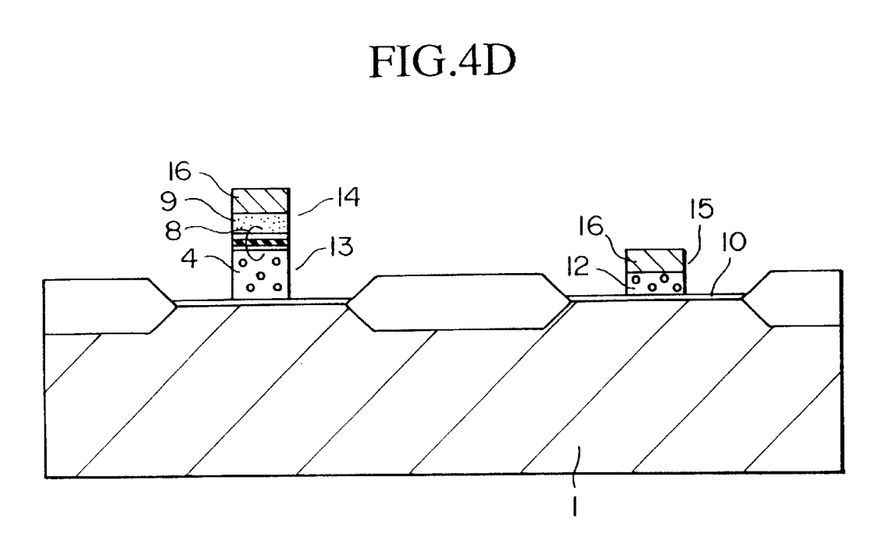

In addition, the present invention provides, according to a second aspect, a method for manufacturing a nonvolatile semiconductor storage device comprising the steps of:

forming an element separating oxide layer onto a semiconductor base for defining a first region for forming a nonvolatile memory cell and a second region for forming an MOS transistor for use in a peripheral circuit;

forming a first gate insulating layer on said first and second regions over a surface of said semiconductor base;

forming a first polysilicon layer over the entire surface of said semiconductor base, and then patterning said first polysilicon layer such that said first polysilicon layer is left covering only said first gate insulating layer of said first region;

sequentially forming a second gate insulating layer and a second polysilicon layer over the entire surface of said first region and said second region;

sequentially removing said second polysilicon layer, said second gate insulating layer and said first gate insulating layer, respectively, in said second region;

forming a third gate oxide layer over a surface of said semiconductor base corresponding to said second region by means of thermal oxidation;

coating a third polysilicon layer over the entire surface of said first region and said second region (FIG. 3A), and patterning said third polysilicon layer such that said third polysilicon layer remains covering said second region only (FIG. 3B); and forming a conducting layer communicating with said second polysilicon layer and said third polysilicon layer (FIG. 4C), and patterning said first, second and third polysilicon layers respectively to from a gate electrode in said first region, wherein a control gate is formed by said conducting layer and second polysilicon layer in the first region and a floating gate is formed by said first polysilicon layer in the first region; and a gate electrode is formed in the second region by said conducting layer and said third polysilicon layer (FIG. 4D).

Consequently, the present invention solves the problems of the aforementioned conventional art by means of layering a second polysilicon layer for forming a control gate immediately after forming a second gate insulating layer over a first polysilicon layer for forming a floating gate, followed by subsequent removal of the second polysilicon layer in the peripheral circuit transistor region, and formation of a third gate insulating layer in this aforementioned region.

PREFERRED EMBODIMENTS OF THE INVENTION

In the following, the preferred embodiments of the present invention will be explained with reference to the figures.

FIGS. 1A~2F are cross sectional diagrams showing a step sequence for explaining a first preferred embodiment of the present invention. As shown in FIG. 1A, a surface of silicon base 1 is selectively oxidized according to the LOCOS method and an element separating oxide layer 2 which defines an elemental area is formed. A first gate insulating layer 3 is then formed on the surface of the sectioned elemental area, followed by layering of a first polysilicon layer 4 for forming a floating gate over the entire surface of silicon base 1. This first polysilicon layer 4 is then patterned such that said first polysilicon layer is selectively left covering only the elemental area of the memory cell array region.

Subsequently, as shown in FIG. 1B, a second gate insulating layer 8 to form an ONO structure, comprising a silicon oxide layer 5, silicon nitride layer 6 and silicon oxide layer 7, is formed by CVD followed by formation of a second polysilicon layer 9 onto the aforementioned second gate insulating layer 8. Subsequently, as shown in FIG. 1C, second polysilicon layer 9 in the peripheral circuit transistor region and in second gate insulating layer 8 are selectively removed by means of an etching process. A gate oxide layer 10 is then formed in the peripheral circuit transistor region, and, at the same time, a silicon oxide layer 11 is formed onto the second polysilicon layer 9, as shown in FIG. 2D.

Subsequently, as shown in FIG. 2E, a third polysilicon layer 12 for forming a gate electrode of a peripheral circuit transistor is deposited onto the entire surface thereof. This third polysilicon layer 12 is then patterned, as shown in FIG. 2F, to form a gate electrode 15 comprising the aforementioned third polysilicon layer 12 in the peripheral circuit transistor region. At this time, silicon oxide layer 11 serves as a protective layer for the second polysilicon layer 9. Second polysilicon layer 9, second gate insulating layer 8 and first polysilicon layer 4 are then patterned to respectively form control gate 14 from second polysilicon layer 9, and floating gate 13 from first polysilicon layer 4 in the memory cell array region.

Using element separating oxide layer 2 and a gate electrode as a mask, impurities are then doped in the surface region of the elemental area to form a source-drain region, followed by formation of an interlayer insulating layer and Al wiring to complete the method for manufacturing a nonvolatile semiconductor storage device according to the present preferred embodiment.

FIGS. 3A~4D are cross sectional diagrams showing a step sequence for explaining a second preferred embodiment of the present invention. According to this preferred embodiment, the step sequence of the first preferred embodiment shown in FIGS. 1A~2E are performed in the same manner to attain the structure shown in FIG. 2E, which is replicated in FIG. 3A. After processed into the state shown in FIG. 3A, the third polysilicon layer 12 of the memory cell array region and silicon oxide layer 11 formed on the surface of second polysilicon layer 9 are subsequently removed by means of an etching process, as shown in FIG. 3B.

A WSi layer 16 is then deposited over the entire surface, as shown in FIG. 4C, and this WSi layer 16 along with third polysilicon layer 12, second polysilicon layer 9, second gate insulating layer 8 and first polysilicon layer 4 are patterned to respectively form the following: a gate electrode 15 from WSi layer 16 and third polysilicon layer 12 in the peripheral circuit transistor region; and a control gate 14 from WSi layer 16 and second polysilicon layer 9, and floating gate 13 from first polysilicon layer 4 in the memory cell array region.

Subsequently, using element separating oxide layer 2 and a gate electrode as a mask, impurities are then doped in the surface region of the elemental area to form a source-drain region, followed by formation of an interlayer insulating layer and Al wiring to complete the method for manufacturing a nonvolatile semiconductor storage device according to the present preferred embodiment.

As described in the aforementioned, according to the method for manufacturing a nonvolatile semiconductor storage device of the present invention, a second polysilicon layer for forming a control gate is formed immediately after forming a second gate insulating layer over a first polysilicon layer for forming a floating gate, followed by subsequent removal of the second polysilicon layer in the peripheral circuit transistor region and formation of a third gate insulating layer in this aforementioned region. As a result, at the time of forming the gate oxide layer of the peripheral circuit transistor, since the memory cell array region is masked by means of the second polysilicon layer, it is possible to prevent thinning of the second gate insulating layer without invading this second gate insulating layer during the washing step before forming the gate oxide layer of the peripheral circuit transistor. Consequently, according to the present invention, it is possible to suppress the leakage of electrons which accumulate at the floating gate to the control gate, and thereby improve the data storage properties.

In addition, according to the manufacturing method of the present invention, the polysilicon layers for respectively forming the floating gate, control gate and peripheral circuit transistor gate are each separately layered, which results in the ability to designate the layer thickness and impurity concentration within each layer to ideal values.

What is claimed is:

1. A method for manufacturing a nonvolatile semiconductor storage device comprising the steps of:

forming an element separating oxide layer onto a semiconductor base for defining a first region for forming a nonvolatile memory cell and a second region for forming an MOS transistor for use in a peripheral circuit;

forming a first gate insulating layer on said first and second regions of a surface of said semiconductor base;

forming a first polysilicon layer over the entire surface of said semiconductor base, and then patterning said first polysilicon layer in a manner such that said first polysilicon layer is left covering only said first gate insulating layer of said first region;

sequentially forming a second gate insulating layer having three insulating layers and a second polysilicon layer over the entire surface of said first region and said second region;

sequentially removing said second polysilicon layer, said second gate insulating layer and said first gate insulating layer, respectively, in said second region;

forming a third gate oxide layer over a surface of said semiconductor base corresponding to said second region by means of thermal oxidation;

coating a third polysilicon layer over the entire surface of said first region and said second region, and patterning said third polysilicon layer to form a gate electrode over said second region; and patterning said second polysilicon layer, said second gate insulating layer, and said first polysilicon layer to form a gate electrode in said first region wherein a control gate is formed by patterning said second polysilicon layer, said second gate insulating layer and said first polysilicon layer, and a floating gate is formed by patterning said first polysilicon layer.

2. A method for manufacturing a nonvolatile semiconductor storage device comprising the steps of:

forming an element separating oxide layer onto a semiconductor base for defining a first region for forming a nonvolatile memory cell and a second region for forming an MOS transistor for use in a peripheral circuit;

forming a first gate insulating layer over a surface of said semiconductor base in said first and second regions;

forming a first polysilicon layer over the entire surface of said semiconductor base, and then patterning said first polysilicon layer such that said first polysilicon layer is left covering only said first gate insulating layer of said first region;

sequentially forming a second gate insulating layer having three insulating layers and a second polysilicon layer over the entire surface of said first region and said second region;

sequentially removing said second polysilicon layer, said second gate insulating layer and said first gate insulating layer, respectively, in said second region;

forming a third gate oxide layer over a surface of said semiconductor base corresponding to said second region by means of thermal oxidation;

coating a third polysilicon layer over the entire surface of said first region and said second region, and patterning said third polysilicon layer such that said third polysilicon layer remains covering said second region only; and forming a conducting layer communicating with said second polysilicon layer and said third polysilicon layer, and patterning said first, second and third polysilicon layers respectively to from a gate electrode in said first region, wherein a control gate is formed by said conducting layer and second polysilicon layer and a floating gate is formed by said first polysilicon layer and a gate electrode is formed in said second region comprising said conducting layer and said third polysilicon layer.

3. A method for manufacturing a nonvolatile semiconductor storage device according to claim 2, wherein said conducting layer comprises a silicide of a high melting point metal.

4. A method for manufacturing a nonvolatile semiconductor storage device according to claim 3, wherein said silicide of a high melting point metal is tungsten silicide (WSi).

5. A method for manufacturing a nonvolatile semiconductor storage device according to claim 1, wherein the three insulating layers of said second gate insulating layer are a silicon oxide layer, silicon nitride layer and a silicon oxide layer.

6. A method for manufacturing a nonvolatile semiconductor storage device according to claim 2, wherein the three insulating layers of said second gate insulating layer are a silicon oxide layer, silicon nitride layer and a silicon oxide layer.

7. A method for manufacturing a nonvolatile semiconductor storage device according to claim 1, wherein said second polysilicon layer, said second gate insulating layer and said first polysilicon layer are served for forming a control gate and said first polysilicon layer is served for forming the floating gate, so that the control gate and the floating gate can be formed after depositing these layers by means of patterning processes.

8. A method for manufacturing a nonvolatile semiconductor storage device according to claim 2, wherein the second polysilicon layer and the conductive layer is served as the control gate, and the first polysilicon layer is served as the floating gate, so that the control gate and the floating gate is formed by means of patterning processes after depositing these layers.

9. A method of manufacturing a nonvolatile semiconductor devices according to claim 1, wherein said third gate oxide layer is formed by thermal oxidization of the second region of the semiconductor base.

10. A method for manufacturing a nonvolatile semiconductor storage device comprising the steps of:

selectively oxidizing a surface of a silicon base according to the LOCOS method so as to form an element separating oxide layer which defines an elemental area and an peripheral circuit transistor region;

forming a first gate insulating layer on the surface of the elemental area;

depositing a first polysilicon layer for forming a floating gate over the entire surface of the silicon base;

then patterning the first polysilicon layer such that the first polysilicon layer is selectively left covering only the elemental area;

then forming a second gate insulating layer having an ONO structure consisting of a first silicon oxide layer, a silicon nitride layer and a second silicon oxide layer by CVD method;

forming a second polysilicon layer onto the second gate insulating layer;

selectively removing the second polysilicon layer in the peripheral circuit transistor region and the second gate insulating layer by means of an etching process;

forming a gate oxide layer in the peripheral circuit transistor region and forming a silicon oxide layer onto the second polysilicon layer;

depositing a third polysilicon layer onto the entire surface so as to form a gate electrode of a peripheral circuit transistor;

patterning the third polysilicon layer so as to form a gate electrode comprising the third polysilicon layer in the peripheral circuit transistor region while using the silicon oxide layer as a protective layer for the second polysilicon layer; and patterning the second polysilicon layer, the second gate insulating layer, and first polysilicon layer, so as to respectively form a control gate from the second polysilicon layer, and a floating gate from the first polysilicon layer in the elemental area.

11. A method according to claim 10, further comprising the steps of:

doping impurities in the surface region of the elemental area to form a source-drain region using the element separating oxide layer and the gate electrode as a mask;

forming an interlayer insulating layer and Al wiring to obtain a nonvolatile semiconductor storage device.

12. A method for manufacturing a nonvolatile semiconductor storage device comprising the steps of:

selectively oxidizing a surface of silicon base according to the LOCOS method so as to form an element separating oxide layer which defines an elemental area and an peripheral circuit transistor region;

forming a first gate insulating layer on the surface of the elemental area;

layering of a first polysilicon layer for forming a floating gate over the entire surface of the silicon base;

then patterning the first polysilicon layer such that the first polysilicon layer is selectively left covering only the elemental area;

then forming a second gate insulating layer having an ONO structure consisting of a first silicon oxide layer, a silicon nitride layer and a second silicon oxide layer by CVD method;

forming a second polysilicon layer onto the second gate insulating layer;

selectively removing the second polysilicon layer in the peripheral circuit transistor region and the second gate insulating layer by means of an etching process;

forming a gate oxide layer in the peripheral circuit transistor region and forming a silicon oxide layer onto the second polysilicon layer;

depositing a third polysilicon layer onto the entire surface so as to form a gate electrode of a peripheral circuit transistor;

removing the third polysilicon layer of the memory cell array region and the silicon oxide layer formed on the surface of the second polysilicon layer by means of an etching process;

depositing a WSi layer over the entire surface; and patterning the WSi layer along with the third polysilicon layer, the second polysilicon layer, the second gate insulating layer and the first polysilicon layer, so as to respectively form a gate electrode from the WSi layer and the third polysilicon layer in the peripheral circuit transistor region; a control gate from the WSi layer and the second polysilicon layer; and a floating gate from the first polysilicon layer in the memory cell array region.

13. A method according to claim 12, further comprising the steps of:

doping impurities in the surface region of the elemental area to form a source-drain region using the element separating oxide layer and the gate electrode as a mask; and forming an interlayer insulating layer and Al wiring to obtain a nonvolatile semiconductor storage device.

* * * * *